(12) United States Patent
Beuer

(10) Patent No.: US 12,588,448 B2
(45) Date of Patent: Mar. 24, 2026

(54) METHOD FOR PREPARING A CROSS SECTION WITH A FOCUSED ION BEAM

(71) Applicant: Fraunhofer-Gesellschaft zur Foerderung der angewandten Forschung e.V., Munich (DE)

(72) Inventor: Susanne Beuer, Erlange (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 224 days.

(21) Appl. No.: 18/506,360

(22) Filed: Nov. 10, 2023

(65) Prior Publication Data

US 2024/0162044 A1 May 16, 2024

(30) Foreign Application Priority Data

Nov. 10, 2022 (DE) .......................... 102022129709.8

(51) Int. Cl.
| | |
|---|---|
| *H01L 21/308* | (2006.01) |
| *H01J 37/20* | (2006.01) |
| *H01L 21/3065* | (2006.01) |

(52) U.S. Cl.
CPC .......... *H01L 21/3081* (2013.01); *H01J 37/20* (2013.01); *H01L 21/3065* (2013.01); *H01J 2237/208* (2013.01)

(58) Field of Classification Search
CPC ............. H01L 21/3081; H01L 21/3065; H01L 21/304; H01L 21/3043; H01J 37/20; H01J 2237/208; H01J 37/3056; H01J 2237/31745; H01J 2237/31749
See application file for complete search history.

(56) References Cited

FOREIGN PATENT DOCUMENTS

JP 2008190998 A * 8/2008

OTHER PUBLICATIONS

Vermeij, et al., "Preventing damage and redeposition during focused ion beam milling: The "umbrella" method", 2018, Ultramicroscopy, 186, 35-41 (Year: 2018).*
Chekurov, et al., "Dry fabrication of microdevices by the combination of focused ion beam and cryogenic deep reactive ion etching", 2010, J . Micromech. Microeng., 20, 085009 (Year: 2010).*

(Continued)

*Primary Examiner* — Patrick S Ott
(74) *Attorney, Agent, or Firm* — Renner, Kenner, Greive, Bobak, Taylor & Weber Co. LPA

(57) ABSTRACT

In a method for preparing a cross section in a substrate, a cut face is created in the substrate with at least one focused ion beam, wherein before and during the creation of the cut face a surface region of the substrate on the edge of the cut face is protected with a hardmask that is made from a doped semiconductor material, provided as a separate part, and positioned on the edge of the cut face with at least one micromanipulator. The method is characterized in that the hardmask is not affixed to the substrate, but instead is held in place with the micromanipulator while the cut face is created. With the method, it is possible to reduce the processing time for creating the cross section and to avoid contamination of the surface by foreign materials in semiconductor manufacturing.

8 Claims, 3 Drawing Sheets

(56)            References Cited

OTHER PUBLICATIONS

Hoshikawa, et al., "Relationship between Gallium Concentration and Resistivity of Gallium-Doped Czochralski Silicon Crystals: Investigation of a Conversion Curve", 2008, Jpn. J. Appl. Phys., 47, 8691 (Year: 2008).*

Grigoras, et al, "The fabrication of silicon nanostructures by local gallium implantation and cryogenic deep reactive ion etching", 2009, Nanotechnology, 20, 065307 (Year: 2009).*

JP-2008190998-A Translation (Year: 2008).*

T. Ishitani et al., "Cross-sectional sample preparation by focused ion beam: a review of ion-sample interaction", Microsc Res Tech. 1996, 35(4), pp. 320-333.

T. Vermeij, E. Plancher, C.C. Tasan, Preventing damage and re deposition during focuse d ion b eam milling: The "umbrella"method, Ultramicroscopy 186 (2018) 35-41.

Tescan True X-Sectioning Product Flyer, Tescan Orsay Holding, Oct. 27, 2021.

* cited by examiner

METHOD FOR PREPARING A CROSS SECTION WITH A FOCUSED ION BEAM

TECHNICAL FIELD

The present invention relates to a method for preparing a cross section in a substrate, in which a cut face is created in the substrate with at least one focused ion beam, wherein a surface region of the substrate is protected on the edge of the cut face with a hardmask before and during the creation of the cut face, the hardmask being provided as a separate part and positioned on the edge of the cut face using at least one micromanipulator.

Focused ion beams are suitable for creating cross sections in substrates, which can then be examined more closely by electron microscopy, for example. Accordingly, FIB systems (FIB: Focused Ion Beam) are used in the semiconductor industry as well as other industries to carry out process controls or fault analyses. With the focused ion beam, a cross section can be prepared locally at a desired position on the substrate without having to fracture and grind the substrate, for example a wafer or the respective component. By creating a suitable cut face with the focused ion beam, only isolated elements or test structures on the substrate are destroyed.

In this situation use is occasionally made of one-beam systems, in which only one ion column is installed vertically, and dual beam systems, in which a second, tilted ion column is arranged in addition to a vertically installed electron column. In this way, cross section micrographs can be made non-destructively using REM (Raster Electron Microscopy) after the cross section has been prepared. The substrate support or stage in these systems can be tilted accordingly.

When producing cut faces for material analyses using FIB, a protective layer or protective mask must be placed to protect the surface before the cut face is created. This layer or mask serves to protect the uppermost material layers, and in the top region to avoid edge rounding and therewith measurement errors.

PRIOR ART

Previously, two different techniques were known for protecting the surface and avoiding edge rounding. In the first technique, a protective layer is deposited in the surface region on the edge of the cut face to the produced, as described for example in T. Ishitani et al., "Cross-sectional sample preparation by focused ion beam: a review of ion-sample interaction", Microsc Res Tech. 1996, 35(4), pages 320-333. When a dual beam system is used, deposition is carried out from the gas phase with the aid of the electron beam and the ion beam. Since deposition of the layer with the ion beam would damage the surface of the sample, a thin first layer (layer thickness approx. 200 nm) must be deposited with the electron beam. A second layer of greater thickness (layer thickness approx. 3 to 8 $\mu$m) is then deposited on this layer by gas induction with the aid of the ion beam. The deeper the cross sections to be created are to extend into the substrate, or the harder the substrate material is, the thicker this layer must be. The total deposition time varies from approx. 20 minutes for standard cuts (approx. 15 $\mu$m wide) up to 60 minutes for larger cross sections (approx. 70 $\mu$m wide).

In the second known technique, instead of the protective layer a cuboid single piece made from a correspondingly hard material is affixed—i.e., bonded or welded—to the surface region as a hardmask. This part is placed in the desired position with the aid of a lift-out system of the FIB unit, that is to say a micromanipulator, and fixed to the edges of the surface by gas-assisted deposition or electron beam-sensitive coating. The needle of the micromanipulator to which this part is attached, is cut off and retracted after fixing. This technique reduces the long deposition times, since fixing only takes 15 minutes, regardless of the size of the cross section to be produced.

Both techniques make use of gas-induced deposition processes, which take up additional time. Moreover, the application of material causes contamination of the substrate surface, which in the field of semiconductor manufacturing leads to contamination problems precisely with regard to the semiconductor materials and processing in cleanrooms. In the worst case, the wafer is then no longer usable, in turn resulting in significant losses, particularly in terms of expensive semiconductor materials.

The problem addressed by the present invention is that of presenting a method for preparing a cross section in a substrate with a focused ion beam, which requires shorter time commitment and causes no contamination of the substrate surface, or at least less contamination than known techniques.

SUMMARY OF THE INVENTION

This problem is solved with the method according to claim 1. Advantageous variants of the method are the objects of the dependent claims or may be discerned from the following description and exemplary embodiment.

In the suggested method for preparing a cross section in a substrate, a cut face is created in the substrate by a preferably straight-line cut with at least one focused ion beam, which cut face can subsequently be examined by electron microscopy for example. Before the cut face is produced with the ion beam, a surface region of the substrate on the edge of the cut face is protected with a hardmask, which is provided in the form of a preferably cuboid single part and positioned on the edge of the desired cut face with at least one micromanipulator. The suggested method is characterized in that the hardmask is not affixed to the surface of the substrate, that is to say not connected to it, but is held in the corresponding position by the micromanipulator while the cut face is created, and that the hardmask is made from a doped semiconductor material, preferably doped silicon. After the cut face has been created, or also after a subsequent examination of the cut face, said hardmask is then removed from the substrate again by means of the micromanipulator.

The suggested method thus does not entail gas-induced deposition processes to produce a protective layer or to affix the hardmask that is provided as a separate part. This in turn means that the process times for these deposition processes are not required. Most particularly, the substrate surface cannot be contaminated by materials used for the deposition.

In a particularly advantageous variant, the hardmask is not placed on the surface of the substrate in the method, so it does not come into contact therewith. Rather, the underside of the hardmask is positioned at the smallest possible distance from the substrate surface, preferably less than 1 $\mu$m. In this context, distances in the range of 100 or several hundred 100 nm are ideal. In this way, it is also possible to produce corresponding cross sections with a separation of such kind from the surface or in the case of porous material or structured surface. The hardmask floats above the substrate surface and does not introduce any contamination to said surface.

In an alternative embodiment, the hardmask may also be placed on the substrate surface and held in the corresponding position there with the micromanipulator. When an electrically conductive variant of the hardmask is used, it is then possible to avoid charging of the substrate by the ion beam. During FIB processing, very many electrical charges are induced on the substrate, either by the ions during processing (positively charged), or also during the optionally subsequent irradiation with electrons (negatively charged) when creating a REM micrograph. In the latter case, the hardmask then remains on the substrate until after the micrograph is completed. The electrical charges are dissipated respectively via the hardmask and the micromanipulator. Apart from this, if the substrate surface has low or poor conductivity (e.g., if coatings or oxide layers are present), the charging of the substrate surface causes the substrate to move during processing. The contact with the needle of the micromanipulator via the electrically conductive hardmask, which is grounded via the needle and the micromanipulator, allows the induced charges to drain off, so that the homogeneity and quality of the cross section can be significantly improved compared with processing in which there is no contact between the hardmask and the substrate. In this embodiment too, contact between the hardmask and the substrate may be removed again by raising it after the cross section is created, or optionally after completing a REM micrograph or the like. Thus, in this case too, no contamination is left on the surface of the substrate.

Particularly in the field of semiconductor manufacturing, the material of the hardmask is preferably selected from a material that is compatible with semiconductor manufacturing processes, that is to say it does not pose a risk of contamination by foreign materials in semiconductor cleanrooms. In this context, hardmasks of doped silicon which satisfy the requirements for a hardmask for ion beams and can be manufactured at reasonable expense may be used particularly advantageously. The hardmasks made from silicon or another semiconductor material are preferably doped in such a way that an electrical conductivity is obtained in the range between 1 S/m and $10^5$ S/m. The use of a material that does not represent contamination with foreign substances in semiconductor cleanrooms means that the material removed from the hardmask by the ion beam through sputtering also does not cause any contamination of the substrate surface during semiconductor manufacturing.

The hardmasks which are used in the suggested method as separate parts, particularly as blocks or wafers, preferably have an edge length in the range from 10 to 1000 µm. In this context, the edge length is understood to be the length of the straight edge of the preferably cuboid part which extends along the edge of the cut face. The edge length must be chosen such that it is at least equal to the width of the cut face on the substrate surface. When Ga-FIB systems are used, hardmasks with edge lengths from 20 to 30 µm are often employed due to the application fields of these systems, for plasma-FIB systems hardmasks with edge lengths in the range from 400 to 500 µm are common. The thickness of the hardmask in a direction perpendicular to the substrate surface may be in the order of magnitude of the thickness of corresponding protective layers, for example in the range between 3 and 25 µm. The width of the hardmasks (perpendicularly to the thickness and the cut edge) may be selected almost at will, providing the hardmasks can still be handled as required. The broader the hardmasks are, the more often they can be used for a method of such kind.

Typical micromanipulators in FIB systems are equipped with a needle, and the hardmask is then attached to the end thereof. The attachment may be carried out for example by gas-supported deposition onto the contact site between the hardmask and the needle, or also entirely in the absence of gas using selective redeposition sputtering by the ion beam. This connection is then also retained during creation of the cross section until the hardmask has been removed from the substrate again by the micromanipulator. It is also possible to use a micromanipulator that picks up and positions the hardmask in a different way, for example with a clamping apparatus.

The suggested method may be implemented in all technical fields in which a cross section is to be created locally in a substrate, wherein the cross section subsequently enables examination, with REM for example. Examples are the fields of life sciences, materials science and semiconductor technology. In these fields, suitable FIB systems and lift-out systems—i.e., corresponding micromanipulators—are used in applications ranging from development in research institutions to production in factories and even including fault analysis. For example, any factory operated by semiconductor component manufacturers will house a number of FIB systems which prepare cross sections for process control in parallel in a shift operation. The method can be implemented in all existing FIB systems with lift-systems. Since the parts used as hardmasks can be manufactured with various dimensions, the method can be incorporated in the widely used Ga-FIB systems as well as in plasma-FIB systems such as those based on Xe.

BRIEF DESCRIPTION OF THE DRAWING

In the following text, the suggested method will be explained briefly again with reference to embodiments thereof, in conjunction with the drawing. In the drawing.

WAYS TO IMPLEMENT THE INVENTION

In the suggested method, a cross section is created locally in a substrate, for example a semiconductor substrate, with a focused ion beam of a FIB system, and can then be analysed, by REM, for example. For the purpose of the method, a hardmask is used as a separate part, in the form of a block, for example, to protect the surface region of the substrate adjacent to the cut face and prevent rounding of the edges. Unlike the previously known technique, the hardmask is not affixed to the substrate surface or firmly attached to the substrate surface, but instead it is left on the manipulator, in particular on the needle of the manipulator, with which it is positioned and kept in this position during processing.

Figure 1A:
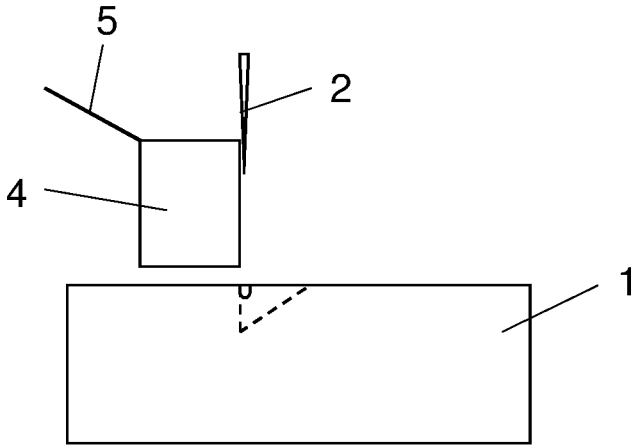
FIG. 1A/B is a schematic representation of a first variant of the suggested method.
Figure 1B:
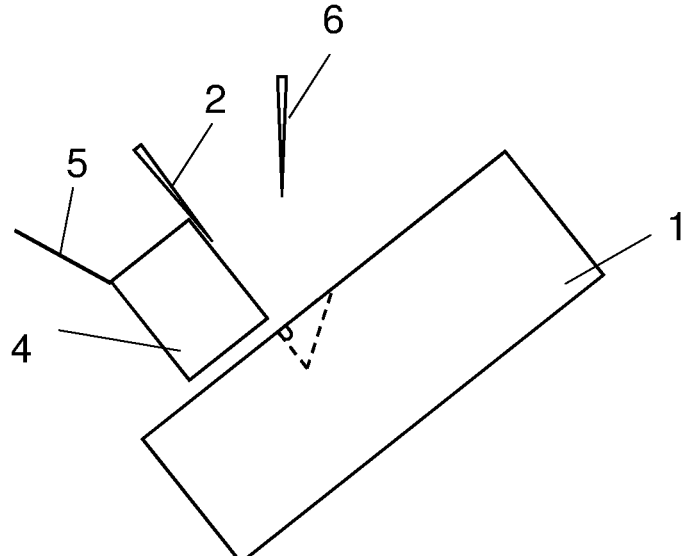

For this purpose, FIG. 1A/B shows a highly simplified first variant of the method, in which the substrate 1, the focused ion beam 2 and the cut face to be created in the substrate 1 are indicated in outline. In this example, the hardmask 4 made of doped silicon attached to the needle 5 of the micromanipulator is positioned above the substrate before processing, in such a way that the lower right edge in this example is located precisely over the edge of the cut face that is to be created. In this example, the positioning is carried out in such manner that the underside of the hardmask 4 is retained at a small distance from the surface of the substrate 1, and consequently does not touch it during processing. Thus, the hardmask 4 floats above the substrate 1 during the processing and does not introduce any contamination onto the substrate surface. The silicon removed from the mask 4 by sputtering with the ion beam 2 during processing, and which comes into contact with the substrate 1, does not constitute contamination by a foreign substance in semiconductor cleanrooms. The hardmask 4 is held in this position throughout the processing operation, that is to say the creation of the desired cut face and is only removed again subsequently with the micromanipulator. Accordingly, the hardmask 4 can be reused multiple times. In this regard, FIG. 1A shows a variant with a single-beam FIB system, in which only a single ion column is installed vertically, FIG. 1B shows a variant with a dual beam FIB system, which includes an ion column that is installed beside a vertically installed electron column and is inclined relative thereto. In both variants, the hardmask 4 must accordingly be attached to the needle 5 of the micromanipulator at different angles, as may be seen in FIGS. 1A and 1B.

Figure 2A:
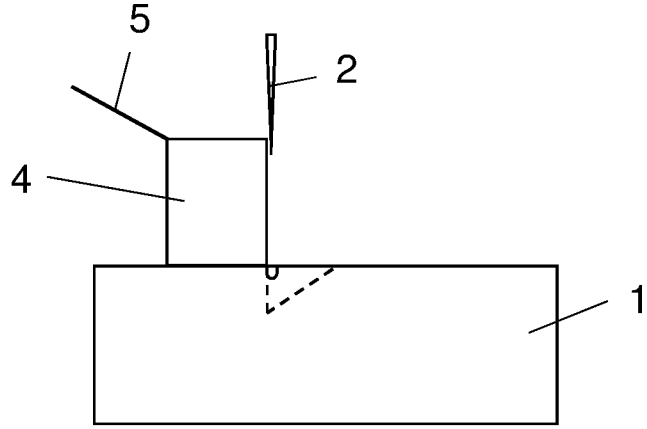
FIG. 2A/B is a schematic representation of a second variant of the suggested method.

In another variant of the suggested method, as illustrated diagrammatically in FIG. 2A/B, the hardmask 4 is held by the manipulator during processing, not at a small distance above the substrate surface, instead it is placed thereon and is then held in this position with the micromanipulator. Due to the doping of the silicon hardmask 4, which is also used in this example, it has an electrical conductivity by which charging of the substrate 1 as a result of processing with the ion beam is avoided. In this situation, the hardmask 4 is grounded correspondingly via the needle 5 and the micromanipulator. Following the creation of the cut face, the hardmask 4 is removed with the micromanipulator from the substrate 1 again and can be reused multiple times. Again, FIG. 2A shows a variant with a single-beam FIB system, in which only one ion column is installed vertically, FIG. 1B shows a variant with a dual beam FIB system in which an ion column is installed in addition to a vertically installed electron column and is inclined with respect thereto. Again, the hardmask 4 must be attached to the needle 5 of the micromanipulator at different angles in both variants, as may be seen in FIGS. 2A and 2B.

Figure 2B:
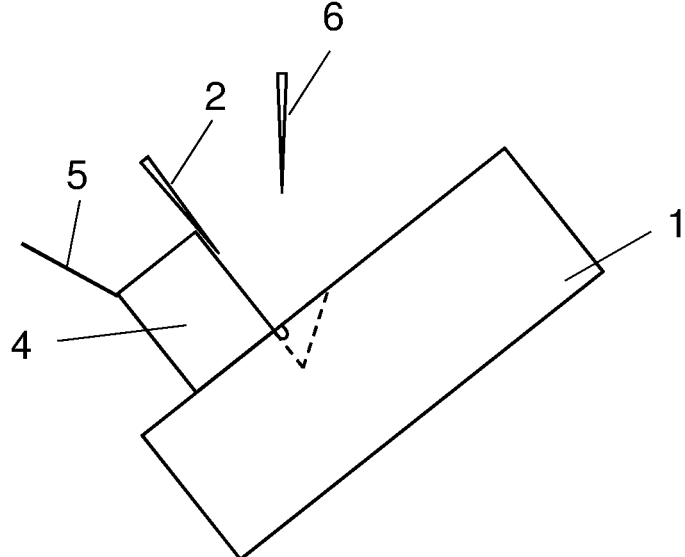
Figure 3A:
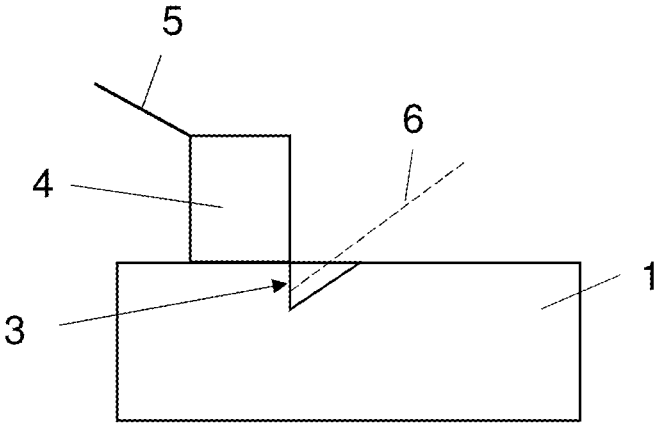
FIG. 3A/B is a schematic representation of the cut face created after performance of the method according to FIG. 2.
Figure 3B:
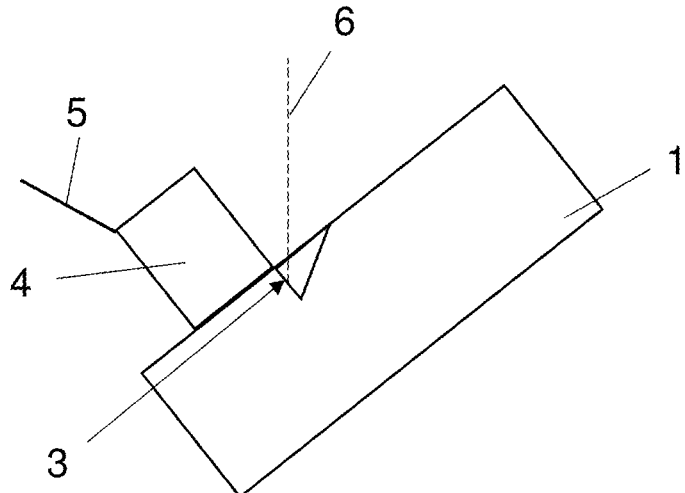

Notably in the variant of FIG. 2, the hardmask may also still remain in place on the substrate for the creation of a REM micrograph of the cut face, in order to avoid charging of the substrate 1 by the electron beam. Dual beam FIB systems include both an ion beam column and an electron beam column which is inclined relative thereto, so that the cut face prepared with the ion beam may then be analysed by creating a REM micrograph with the electron beam. In this respect, FIG. 3A/B is a highly simplified representation of the cut face 3 produced with the ion beam, and the electron beam 6 directed at said cut face for creating a REM micrograph, for the single beam FIB system of FIG. 2A (FIG. 3A) and for the dual beam FIB system of FIG. 2B (FIG. 3B) respectively. In this context, the ion beam produced a correspondingly larger depression in the substrate 1, one side wall of which constitutes the desired cut face 3, as is indicated in FIG. 3A/B.

With the variant of the method that does not involve contact between the hardmask and the substrate surface, by suitable selection of the hardmask material the substrate surface is not contaminated during cleanroom processes in semiconductor manufacturing. The method offers time savings compared with the prior techniques listed in the introduction to the description, which—depending on the technique—may take between 15 and 60 minutes. The hardmasks used in the method can be reused multiple times and thus lower the costs of the preparation. The same advantages are obtained in the other variant of the method, in which the hardmask is placed on the substrate surface. In addition, this variant may also serve to achieve a reduction of charges of the substrate by draining off the electrical charges through the hardmask, which is grounded via the micromanipulator. Of course, the method enables not only processing of semiconductor substrates, but also of substrates made from other materials, such as ceramic, metal, polymer or composite materials. The method may also be used to create fins in the substrate, which can subsequently be detached and analysed by means of TEM, for example. The production of fins requires the creation of two cut faces that are parallel to one another and at a small distance from each other corresponding to the thickness of the fins.

LIST OF REFERENCE NUMERALS

1 Substrate
2 Focused ion beam
3 Cut face
4 Hardmask
5 Needle of the micromanipulator
6 Electron beam

The invention claimed is:

1. A method for preparing a cross section in a substrate (1) with a focused ion beam (2), in which a cut face (3) is created in the substrate (1) with the ion beam (2), wherein a surface region of the substrate (1) on an edge of the cut face (3) is protected before and during creation of the cut face (3) with a hardmask (4) made from a doped semiconductor material, provided as a separate part and positioned on the edge of the cut face (3) with a micromanipulator, wherein the hardmask (4) is not affixed to the substrate (1), but is held in place with the micromanipulator during creation of the cut face (3).

2. The method according to claim 1,
characterized in that
a hardmask made of doped silicon, is used as the hardmask (4).

3. The method according to claim 1,
characterized in that
an electrically conductive hardmask with a conductivity between 1 S/m and 105 S/m is used as the hardmask (4).

4. The method according to claim 1,
characterized in that
the hardmask (4) is attached to a needle (5) of the micromanipulator before positioning.

5. The method according to claim 1,
characterized in that
the hardmask (4) is positioned at a distance of less than 1 μm above the surface region.

6. The method according to claim 1,
characterized in that
the hardmask (4) has an edge length of an edge of the hardmask (4) positioned on the edge of the cut face (3) which is between 10-600 μm.

7. The method according to claim 1,
characterized in that
the cut face (3) is created in the substrate (1) by a straight cut.

8. The method according to claim 1 for preparing the cross section in a semiconductor substrate in semiconductor manufacturing.

* * * * *